United States Patent
Shirato

(10) Patent No.: US 8,721,046 B2
(45) Date of Patent: May 13, 2014

(54) INK JET PRINTING HEAD, INK JET PRINTING DEVICE, AND INK JET PRINTING HEAD MANUFACTURING DEVICE

(75) Inventor: Takeo Shirato, Ibaraki (JP)

(73) Assignee: Ricoh Company, Ltd., Tokyo (JP)

( * ) Notice: Subject to any disclaimer, the term of this patent is extended or adjusted under 35 U.S.C. 154(b) by 74 days.

(21) Appl. No.: 13/539,897

(22) Filed: Jul. 2, 2012

(65) Prior Publication Data

US 2013/0010019 A1 Jan. 10, 2013

(30) Foreign Application Priority Data

Jul. 6, 2011 (JP) ................................ 2011-150276
Feb. 14, 2012 (JP) ................................ 2012-029458

(51) Int. Cl.
*B41J 2/16* (2006.01)
*B41J 2/045* (2006.01)
*B41J 2/14* (2006.01)

(52) U.S. Cl.
CPC ............. *B41J 2/16* (2013.01); *H05K 2201/055* (2013.01); *B41J 2/14201* (2013.01)
USPC .............................................. 347/50; 347/68

(58) Field of Classification Search
USPC .......................................................... 347/50
See application file for complete search history.

(56) References Cited

U.S. PATENT DOCUMENTS

| | | | |
|---|---|---|---|
| 5,411,343 A | 5/1995 | Childers | |
| 6,000,773 A | 12/1999 | Murray et al. | |
| 2004/0183859 A1* | 9/2004 | Ito | 347/50 |
| 2006/0044355 A1* | 3/2006 | Ito | 347/59 |
| 2006/0071959 A1* | 4/2006 | Ito et al. | 347/9 |
| 2006/0264704 A1 | 11/2006 | Fujimori et al. | |
| 2007/0008378 A1 | 1/2007 | Kanda | |
| 2007/0229596 A1* | 10/2007 | Chikamoto et al. | 347/50 |
| 2010/0156994 A1 | 6/2010 | Shimomura et al. | |
| 2010/0231627 A1* | 9/2010 | Kondo | 347/14 |
| 2013/0076839 A1* | 3/2013 | Nystrom et al. | 347/71 |

FOREIGN PATENT DOCUMENTS

| | | |
|---|---|---|
| EP | 0 526 013 A2 | 2/1993 |
| EP | 0 571 093 A2 | 11/1993 |
| EP | 0 832 747 A2 | 4/1998 |
| EP | 2 072 266 A1 | 6/2009 |
| JP | 2000-246893 | 9/2000 |
| JP | 4429745 | 12/2009 |

OTHER PUBLICATIONS

Extended European Search Report issued Jan. 30, 2013 in European Patent Application No. 12174802.4.

* cited by examiner

*Primary Examiner* — Shelby Fidler
(74) *Attorney, Agent, or Firm* — Oblon, Spivak, McClelland, Maier & Neustadt, L.L.P.

(57) ABSTRACT

An ink jet printing head includes a head portion, an ink tank, a first rigid circuit board, a second rigid circuit board, a flexible printed circuit board, and a connector. The connector is disposed on a top surface of the ink tank, the first rigid circuit board is disposed on a side of the ink tank, the second rigid circuit board is disposed between the ink tank and the head portion, and the flexible printed circuit board is disposed in a bent condition between the first rigid circuit board and the second rigid circuit board.

9 Claims, 12 Drawing Sheets

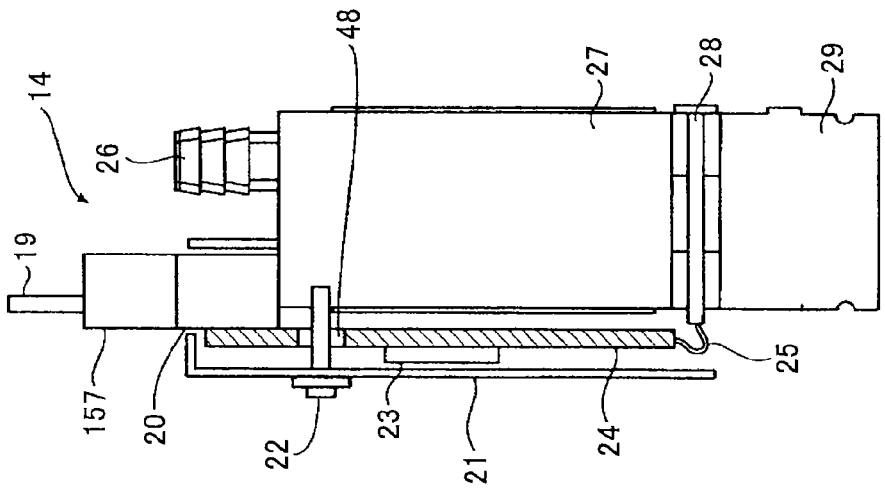
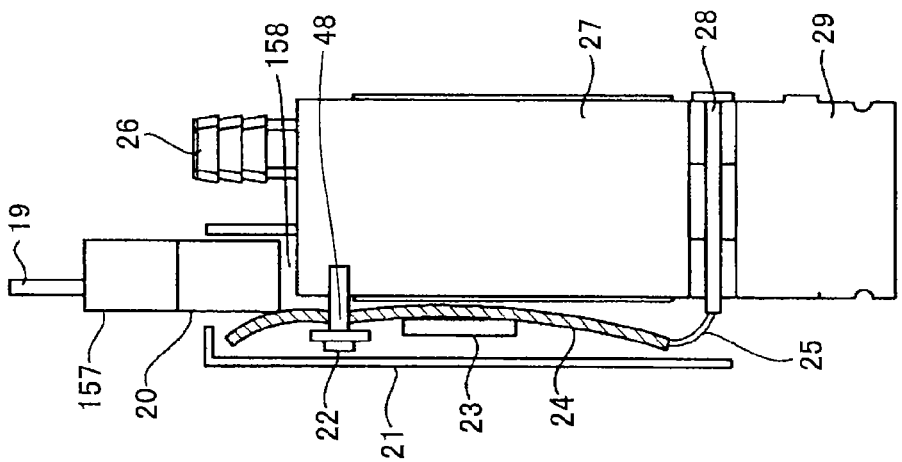

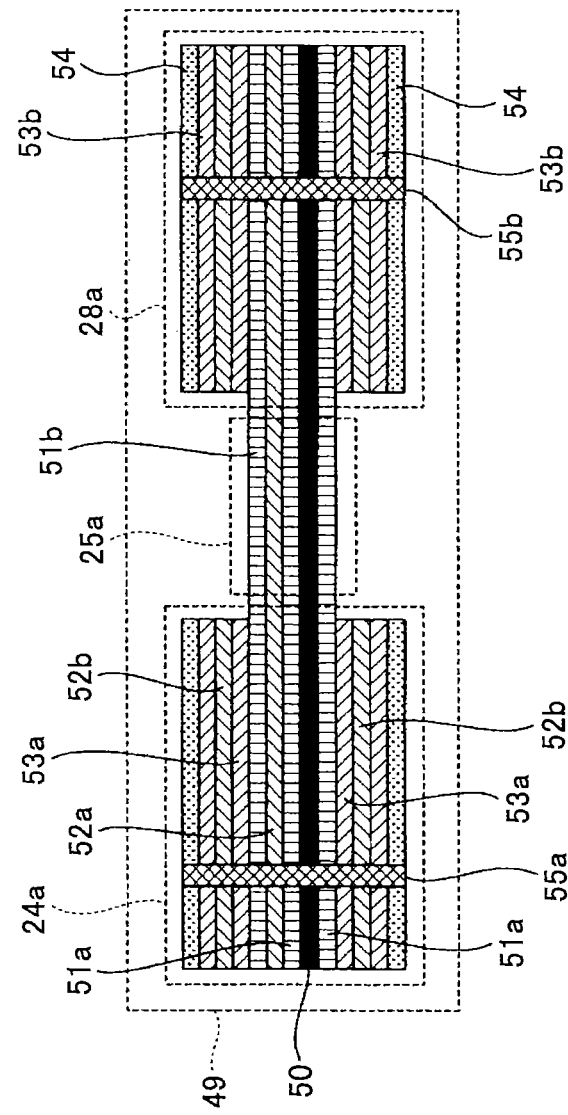

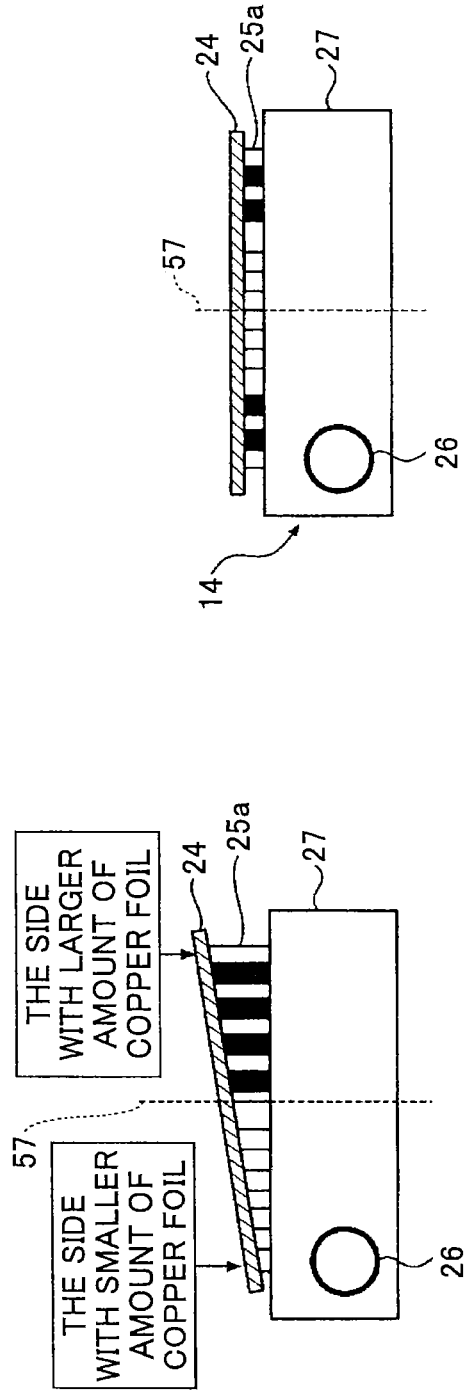

INK JET PRINTING HEAD, INK JET PRINTING DEVICE, AND INK JET PRINTING HEAD MANUFACTURING DEVICE

BACKGROUND OF THE INVENTION

1. Field of the Invention

The present disclosure generally relates to an ink jet printing head for use in an ink jet printing device, and more particularly to an ink jet printing head having a printed circuit board to supply power and transmit signals, such as an image data signal and a driving waveform signal.

2. Description of the Related Art

FIG. 14 shows an ink jet printing head according to the related art as an example. As shown in FIG. 14, in the ink jet printing head according to the related art, an image-data control circuit board 102 is arranged outside a printing head main part 101, and the printing head main part 101 and the image-data control circuit board 102 are connected together by a flexible printed circuit board 103.

Although not illustrated, a host board is arranged to generate a driving waveform and image data to drive a piezoelectric device (a driving element) for discharging an ink drop from a nozzle. The host board and the image-data control circuit board 102 include connectors mounted on the circuit boards, respectively. The connectors mounted on the host board and the connectors mounted on the image-data control circuit board 102 are electrically connected together via a twistable flat cable.

On the other hand, Japanese Laid-Open Patent Publication No. 2005-204927 discloses a capsule type medical device which is adapted to improve the efficiency of storage of a plurality of rigid circuit boards in an airtight container. The capsule type medical device includes a flexible printed circuit board which links together the rigid circuit boards in a series connection, and the flexible printed circuit board is mounted in the airtight container in a bent condition so that the adjoining rigid circuit boards thereof face each other.

In the ink jet printing head according to the related art shown in FIG. 14, the image-data control circuit board 102 is arranged outside the printing head main part 101, and it is necessary to secure the housing space of the image-data control circuit board 102 in an ink jet printing device. This will become an obstacle to miniaturization of the ink jet printing device.

The printing head main part 101 and the image-data control circuit board 102 are connected together by the flexible printed circuit board 103. When attaching the printing head main part 101 to a printing device or when exchanging the printing head main part 101, an assembly-line worker has to hold the printing head main part 101 and the image-data control circuit board 102 by both hands, and the workability is poor.

To improve the workability, the flexible printed circuit board 103 may be shortened to the size of several millimeters and the image-data control circuit board 102 may be housed in the printing head main part 101. However, the shortened flexible printed circuit board 103 will be difficult to bend, and the original flexibility of the flexible printed circuit board 103 will be lost.

Moreover, a mechanical stress is generated in the printing head main part 101 at a time of connection of a twistable flat cable thereto and concentrated onto the fixed portion of the image-data control circuit board 102. At this time, the image-data control circuit board 102 may be curved or deformed. In such a case, cracks in the soldered parts of the image-data control circuit board 102 are likely to take place.

In the capsule type medical device disclosed in Japanese Laid-Open Patent Publication No. 2005-204927, the flexible printed circuit board is mounted in the capsule type medical device in a bent condition so that the adjoining rigid circuit boards may face each other. There is no need to secure the housing space of connectors in the capsule type medical device, and the efficiency of storage of the rigid circuit boards in the airtight container can be improved.

However, the arrangement of the capsule type medical device described above does not serve to improve the workability of assembling an ink jet printing head into an ink jet printing device, and does not function to prevent the cracks in the soldered parts of a printed circuit board from occurring during the assembling work.

SUMMARY OF THE INVENTION

In one aspect, the present disclosure provides an ink jet printing head with good quality which does not cause deformation or curving of a rigid circuit board due to a mechanical stress generated at a time of connection of a twistable flat cable and concentrated onto the fixed portion of the rigid circuit board and does not cause occurrence of cracks or the like in connected portions of the rigid circuit board, such as soldered portions.

In an embodiment, the present disclosure provides an ink jet printing head including: a head portion including nozzles, pressure chambers which store ink and communicate with the nozzles, and driving elements which pressurize the ink in the pressure chambers to discharge ink drops from the nozzles; an ink tank disposed over the head portion to accommodate ink which is supplied to the pressure chambers of the head portion; a first rigid circuit board including an image-data control unit to output an image-data signal; a second rigid circuit board including a driving element driver unit to output a driving waveform signal to the driving elements of the head portion in accordance with the image-data signal output from the first rigid circuit board; a flexible printed circuit board arranged to electrically interconnect the first rigid circuit board and the second rigid circuit board; and a connector attached to an end portion of the first rigid circuit board opposite to the flexible printed circuit board and connected to the image-data control unit so that the image-data control unit is connectable to a host board through the connector, wherein the connector is disposed on a top surface of the ink tank, the first rigid circuit board is disposed on a side of the ink tank, the second rigid circuit board is disposed between the ink tank and the head portion, and the flexible printed circuit board is disposed in a bent condition between the first rigid circuit board and the second rigid circuit board.

Other objects, features and advantages of the present disclosure will become more apparent from the following detailed description when read in conjunction with the accompanying drawings.

BRIEF DESCRIPTION OF THE DRAWINGS

FIG. 7A and FIG. 7B are diagrams showing the positional relationship of a connector at a time of connection of a twistable flat cable and the outline composition of a flexible printed circuit board for each of a comparative example and the present embodiment.

FIG. 8 is an enlarged cross-sectional view of a rigid/flexible printed circuit board in the ink jet printing head.

FIG. 11A and FIG. 11B are top views of printing head main parts of the comparative example and the present embodiment.

DETAILED DESCRIPTION OF THE PREFERRED EMBODIMENTS

A description will be given of embodiments of the present disclosure with reference to the accompanying drawings.

Figure 1:
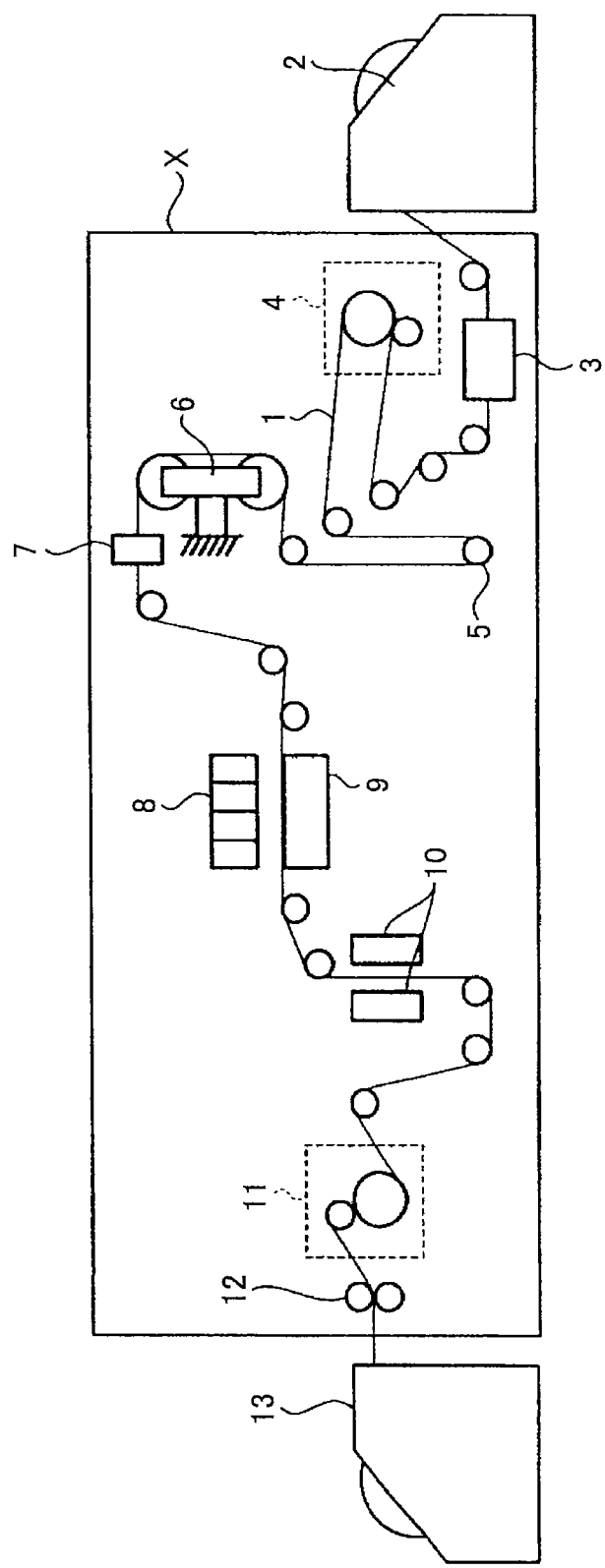
FIG. 1 is a diagram showing the composition of an on-demand line-scan type ink jet printing device including an ink jet printing head according to a first embodiment of the present disclosure.

FIG. 1 shows the composition of an on-demand, line-scan type ink jet printing device including an ink jet printing head according to a first embodiment of the present disclosure.

As shown in FIG. 1, the ink jet printing device X is arranged between a recording sheet supplying part 2 and a recording sheet collecting part 13. A continuous recording sheet 1 is fed from the recording sheet supplying part 2 at high speed, a desired color image is formed thereon by the ink jet printing device X, and the recording sheet is rolled up and collected by the recording sheet collecting part 13.

The ink jet printing device X includes a sheet transporting device which transports the recording sheet from the recording sheet supplying part 2 to the recording sheet collecting part 13. The sheet transporting device generally includes a position regulating guide 3, an in-feed part 4, a level roller 5, an EPC (edge position control) part 6, a meandering amount detector 7, an out-feed part 11, and a puller 12.

The position regulating guide 3 is arranged to position the recording sheet 1 supplied from the recording sheet supplying part 2, in the width direction thereof. The in-feed part 4 is composed of a driving roller and a follower roller. The level roller 5 is moved up and down in accordance with the tension of the recording sheet 1 and outputs a position signal. The EPC part 6 is arranged to prevent meandering of the recording sheet 1. The meandering amount detector 7 is arranged to detect the amount of meandering of the recording sheet 1 for the feedback control. The out-feed part 11 is composed of a driving roller and a follower roller, and these rollers are rotated at a constant speed in order to transport the recording sheet 1 at a predetermined speed. The puller 12 is composed of a driving roller and a follower roller, and these rollers are rotated to eject the recording sheet 1 outside the ink jet printing device.

The recording sheet transporting device is a tension-control type transporting device which detects the position of the level roller 5 and controls the rotation of the in-feed part 4 so that the tension of the recording sheet 1 being transported is maintained at a constant level. In the ink jet printing device X, an ink jet printing head 8, a platen 9 disposed to face the ink jet printing head 8, and a drying unit 10 are arranged.

The ink jet printing head 8 has a line head in which the nozzles are arranged to cover the whole printing width. In a case of color printing, the line heads of black, cyan, magenta and yellow are used to perform the color printing; the line heads are supported so that the nozzle surfaces of the line heads are maintained with a predetermined clearance between the nozzle surfaces and the platen 9. The ink jet printing head 8 performs discharging of ink drops to the recording sheet 1 in synchronization with the sheet transport speed so that a color image is formed on the recording sheet 1.

The drying unit 10 is arranged to perform drying and fixing of the ink from the ink jet printing head 8 to the recording sheet. In the present embodiment, a non-contact type dryer which is disposed apart from the recording sheet 1 is used as the drying unit 10. Alternatively, a contact type dryer may be used instead.

Figure 2:
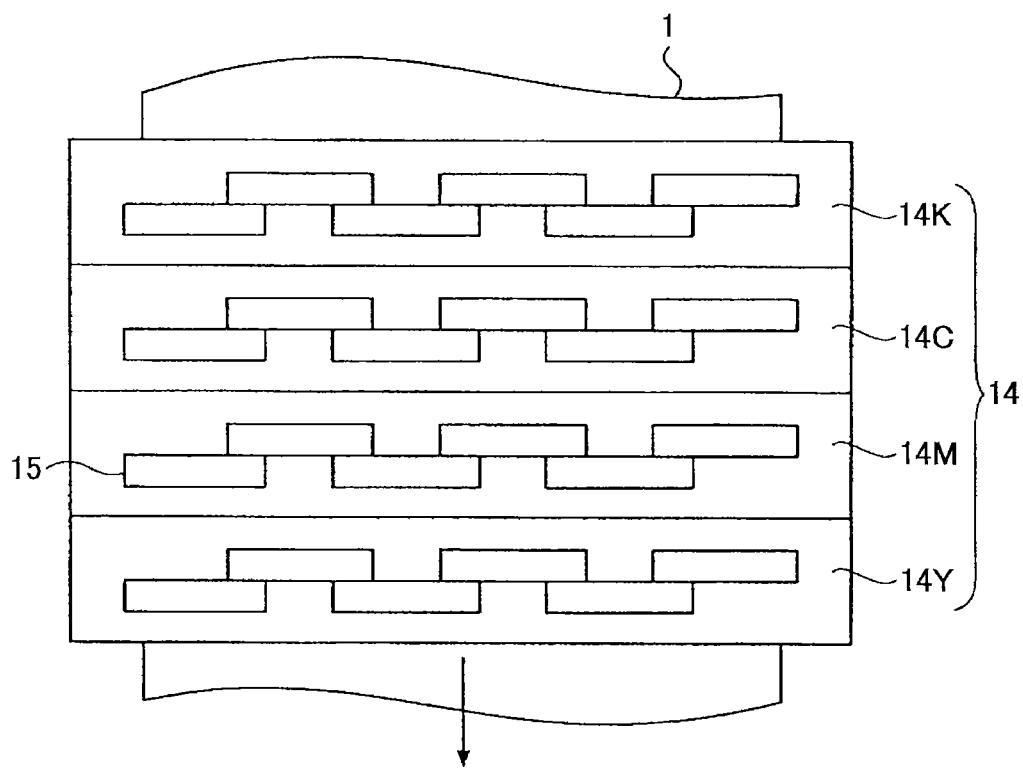
FIG. 2 is a diagram showing the composition of a printing head main part in the ink jet printing head of the present embodiment.

FIG. 2 shows the composition of a printing head main part 14 in the ink jet printing head 8.

As shown in FIG. 2, the printing head main part 14 in this embodiment is the assembly of multiple head arrays including a black head array 14K for discharging ink drops of black, a cyan head array 14C for discharging ink drops of cyan, a magenta head array 14M for discharging ink drops of magenta, and a yellow head array 14Y for discharging ink drops of yellow.

Each of the head arrays 14K, 14C, 14M and 14Y extends in a direction which is perpendicular to a transporting direction of a recording sheet 1 as indicated by the arrow in FIG. 2. Hence, with the use of the multiple head arrays as the printing head main part 14, it is possible to secure a wide printing area.

Further, as shown in FIG. 2, each of the head arrays 14K, 14C, 14M and 14Y includes plural head units 15. In the present embodiment, the head units 15 are arrayed in two rows in a staggered formation, each row including three head units. Hence, with the arrangement of the plural head units 15 in a staggered formation, it is possible to reduce the size of the printing head main part 14.

Figure 3:
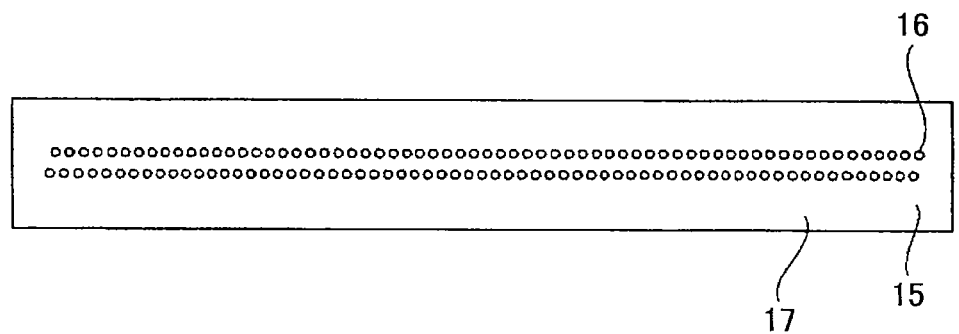
FIG. 3 is an enlarged bottom view of a head unit in the ink jet printing head of the present embodiment.

FIG. 3 is an enlarged bottom view of a head unit 15 in the printing head main part 14.

As shown in FIG. 3, a number of nozzles 16 are arranged in a staggered formation on a nozzle surface (bottom face) 17 of the head unit 15. In the present embodiment, the nozzles 16 are arrayed in two rows in a staggered formation, each row including 64 nozzles. Hence, with the arrangement of the nozzles 16 in a staggered formation, it is possible to form an image with a high resolution.

Figure 4:
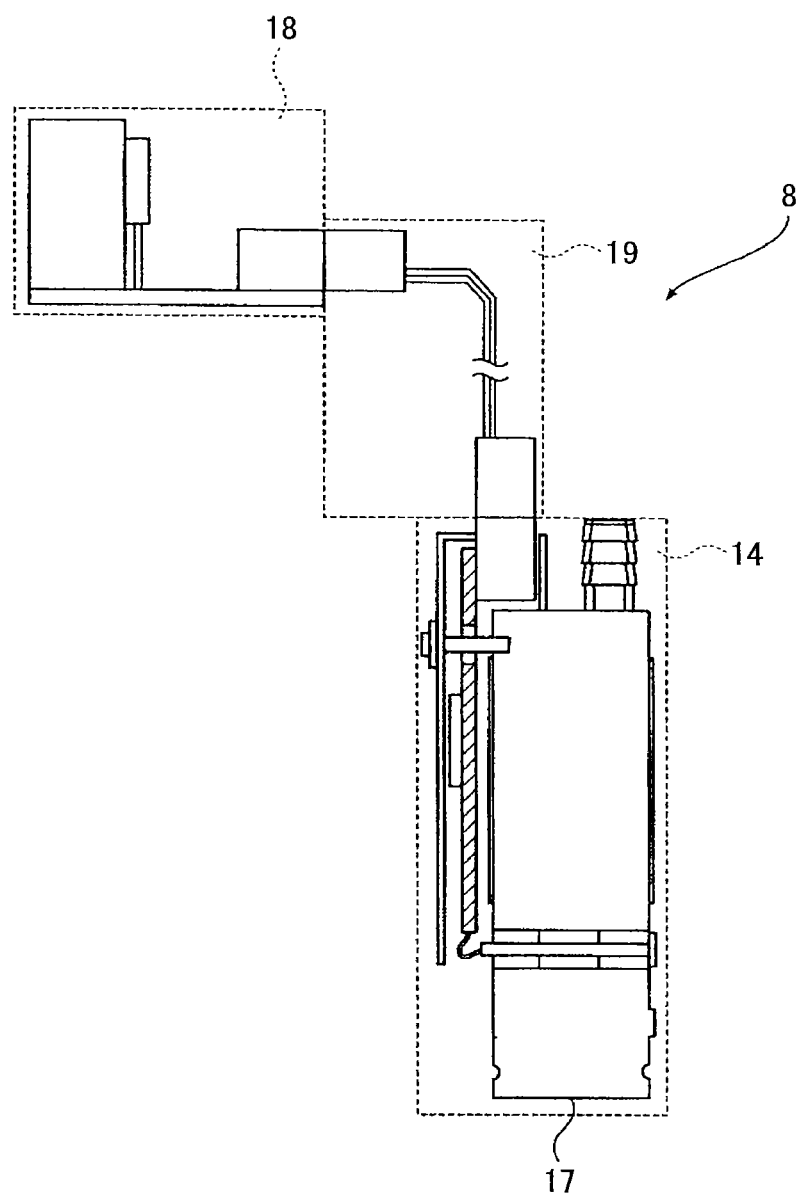
FIG. 4 is a side view of the ink jet printing head of the present embodiment.

FIG. 4 is a side view of the ink jet printing head of the present embodiment.

As shown in FIG. 4, the ink jet printing head 8 generally includes the printing head main part 14, a driver board (host board) 18, and a twistable flat cable 19.

The driver board 18 is a rigid circuit board in which a circuit for generating driving waveform signals and image-data signals for driving the piezoelectric devices (which will be described later) in the printing head main part 14 is mounted. The twistable flat cable 19 is arranged to electrically connect the printing head main part 14 to the driver board 18.

As shown in FIG. 4, the nozzle surface 17 is formed on the side of the bottom face of the printing head main part 14. If the printing head main part 14 malfunctions and needs servicing, the twistable flat cable 19 is removed and only the printing head main part 14 is replaced by a new one.

For the sake of simplification, in FIG. 4, the one-to-one composition of the driver board 18 and the printing head main part 14 is illustrated. Alternatively, plural printing head main parts 14 may be connected to a single driver board 18 so that the plural printing head main parts 14 are driven by using the single driver board 18.

Figure 5:
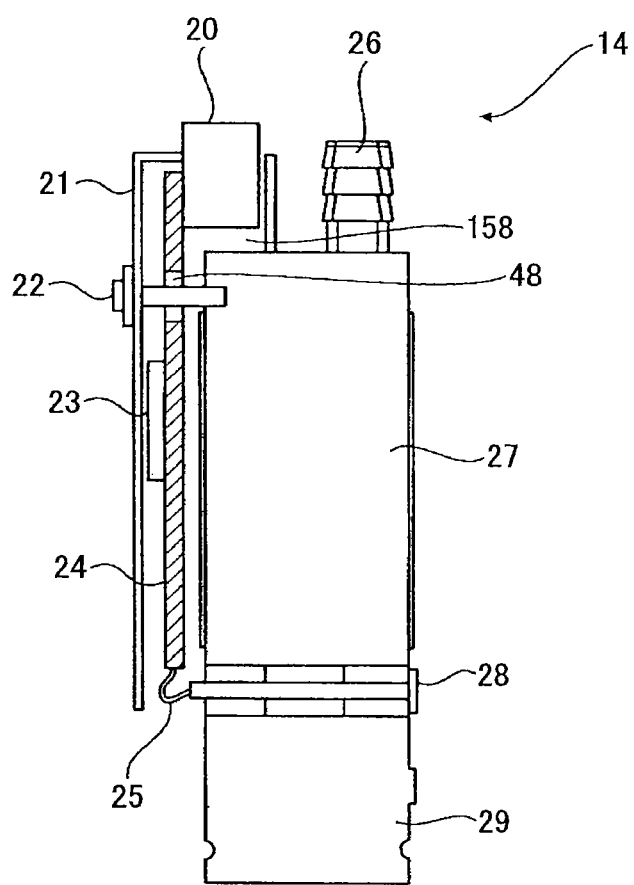
FIG. 5 is a side view of a printing head main part in the ink jet printing head of the present embodiment.

FIG. 5 is a side view of the printing head main part 14 of the present embodiment.

As shown in FIG. 5, the printing head main part 14 generally includes a head cover 21, an image-data control circuit board 24, a flexible printed circuit board 25, an ink tank 27, a head board 28, and a head portion 29.

The image-data control circuit board 24 is a first rigid circuit board on which an image-data control IC 23 and a connector 20 are mounted. The image-data control IC 23 has a function to convert the image-data signal serially transferred from the host driver board 18 (see FIG. 4) into image data in a parallel transfer format. The connector 20 is electrically connected to the image-data control IC 23. The connector 20 is formed with a latching capability. The connector 20 is latched to the upper portion of the image-data control circuit board 24 in order to prevent separation of the connector from the image-data control circuit board 24 even when the twistable flat cable 19 (see FIG. 4) is accidentally pulled by an external force.

As shown in FIG. 5, the flexible printed circuit board 25 is arranged to electrically connect the image-data control circuit board 24 and the head board 28. The flexible printed circuit board 25 is made of a flexible source material, and this printed circuit board is able to be easily bent.

The head board 28 is a second rigid circuit board on which a piezoelectric device driver IC 47 (see FIG. 6) is mounted. Pads to be connected to piezoelectric device supporting boards 45 (see FIG. 6) in the head portion 29 are formed on the head board 28. The head board 28 is disposed between the head portion 29 and the ink tank 27. The internal composition of the head portion 29 will be described later with reference to FIG. 6.

Figure 6:
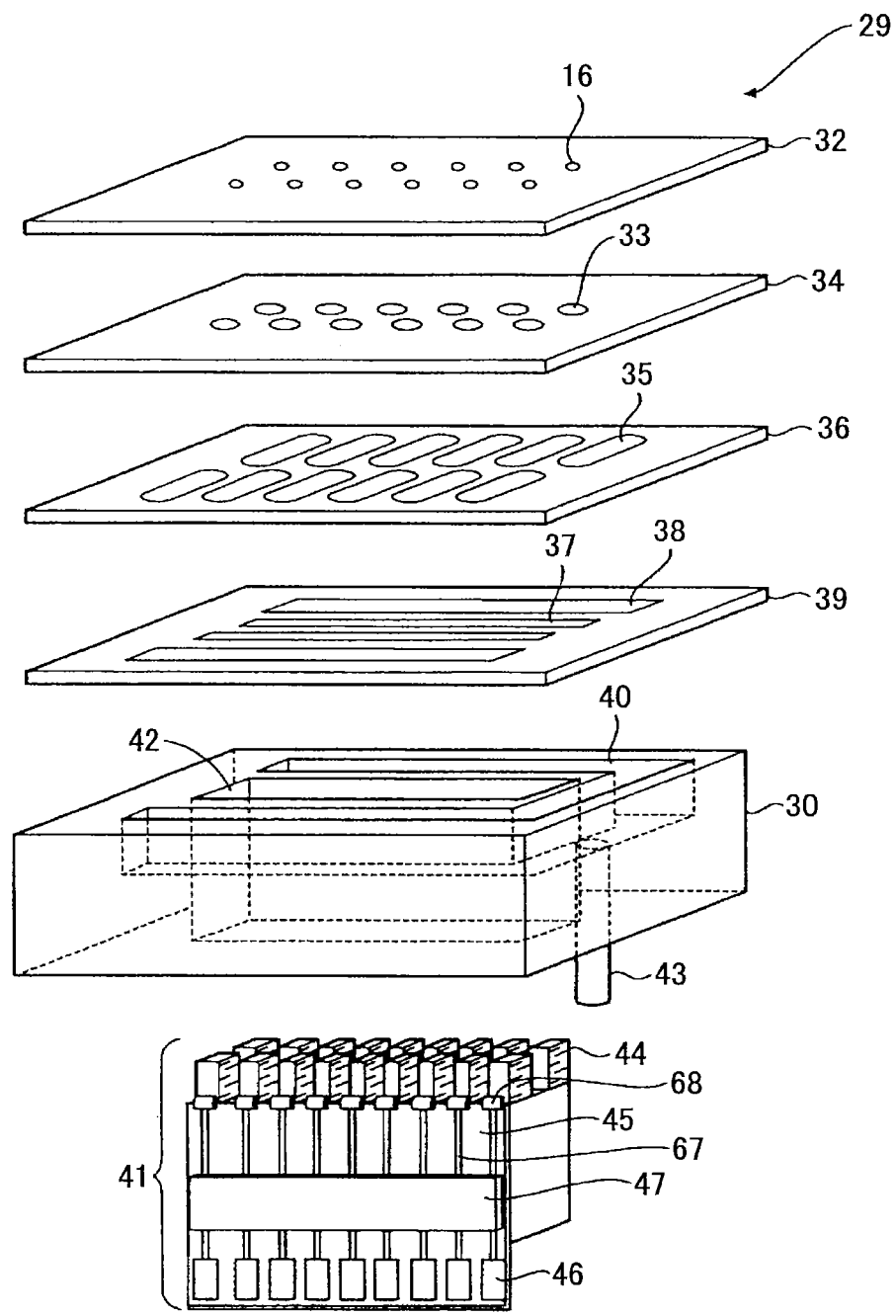
FIG. 6 is an exploded perspective view of a head portion in the ink jet printing head of the present embodiment.

The ink tank 27 is for temporarily accommodating the ink which is discharged from the nozzles 16 (see FIG. 3 or FIG. 6). The ink is supplied to the ink tank 27 through a joint part 26, and this joint part 26 is attached to the upper portion of the ink tank 27. The composition of a host device located above the joint part 26 is not relevant to the present disclosure and a description thereof will be omitted.

As shown in FIG. 5, the head portion 29 is attached to the lower portion of the ink tank 27 via the head board 28. The image-data control circuit board 24 is mounted on the side of the ink tank 27 and the flexible printed circuit board 25 is in a bent condition as shown in FIG. 5. Hence, it is possible to improve the efficiency of storage of the printed circuit board 25.

The reason that the flexible printed circuit board 25 has a bellows configuration will be described later with reference to FIG. 7B. In the present embodiment, the connector 20 is attached to the upper portion of the image-data control circuit board 24 and stacked and fixed onto the top surface of the ink tank 27.

The head cover 21 is arranged to protect the image-data control circuit board 24 and the flexible printed circuit board 25 from mechanical stresses and to prevent the adhesion of ink to the image-data control circuit board 24. The head cover 21 is disposed so that the image-data control circuit board 24 and the flexible printed circuit board 25 are enclosed in the head cover 21. The head cover 21 is fixed to the side of the ink tank 27 by a fixing screw 22.

A through hole 48 is formed in a portion of the image-data control circuit board 24 corresponding to the position of the fixing screw 22. The fixing screw 22 is inserted from the outside of the head cover 21, passes through the through hole 48 and is fastened to the side of the ink tank 27. In this manner, the image-data control circuit board 24 is attached to the ink tank 27 integrally. Hence, when attaching the printing head main part 14 to a printing device or when exchanging the printing head main part 14, an assembly-line worker can hold the printing head main part 14 by one hand. Therefore, the workability can be improved.

By utilizing the fabrication technology of a rigid/flexible circuit board according to the present disclosure, the image-data control circuit board 24, the flexible printed circuit board 25 and the head board 28 can be connected together in a series connection without using connectors between two adjacent ones of the circuit boards 24, 25 and 28. The composition of the rigid/flexible circuit board will be described later with reference to FIG. 8.

FIG. 6 is an exploded perspective view of the head portion 29.

As shown in FIG. 6, the head portion 29 generally includes a nozzle plate 32, a pressure chamber plate 34, a restrictor plate 36, a diaphragm plate 39, a rigid plate 30, and a piezoelectric device array 41.

In the nozzle plate 32, a number of nozzles 16 are formed and arrayed in a staggered formation. In the pressure chamber plate 34, the number of pressure chambers 33 corresponding to the number of the nozzles 16 are formed and arrayed in a staggered formation. In the restrictor plate 36, the number of restrictors 35 corresponding to the number of pressure chambers 33 are formed to allow the respective pressure chambers 33 to communicate with a common ink passage 40 and control the flow rate of ink to the respective pressure chambers 33. In the diaphragm plate 39, a diaphragm 37 and a filter 38 are formed.

As shown in FIG. 6, the nozzle plate 32, the pressure chamber plate 34, the restrictor plate 36, and the diaphragm plate 39 are sequentially stacked, positioned and bonded so that a passage plate in the head portion 29 is constructed by the lamination of the plates 32, 34, 36 and 39.

This passage plate is bonded to the rigid plate 30, and the filter 38 is positioned to face the opening of the common ink passage 40. In the rigid plate 30, an ink introducing pipe 43 has an upper-end opening connected to the common ink passage 40, and has a lower-end opening connected to the ink tank 27 shown in FIG. 5.

In the piezoelectric device array 41, the piezoelectric devices 44 are arranged on the piezoelectric device supporting boards 45. The piezoelectric device array 41 is inserted into an opening 42 formed in the rigid plate 30, and the free ends of the piezoelectric devices 44 are bonded to the diaphragm 37 and fixed to the diaphragm 37, so that the head portion 29 is produced.

In the piezoelectric device array 41, electrode pads 46 which are connected to the head board 28 shown in FIG. 5 are formed and arrayed on the piezoelectric device supporting boards 45. The electrical connections between the electrode pads 46 and the head board 28 are established by soldering. A piezoelectric device driver IC 47 is mounted on the piezoelectric device supporting boards 45. The piezoelectric device driver IC 47 functions to output a driving waveform signal to each of the piezoelectric devices 44 in accordance with the image-data signal transferred in parallel by the image-data control circuit board 24.

In FIG. 6, reference numeral 67 denotes a copper-foil pattern for electrically connecting the piezoelectric devices 44 and the piezoelectric device driver IC 47. Reference numeral 68 denotes piezoelectric-device connecting electrode pads for electrically connecting the piezoelectric devices 44 and the copper-foil pattern 67. These electrode pads 68 are used to interconnect the corresponding piezoelectric devices 44 and the piezoelectric device supporting board 45.

For the sake of simplification, a reduced number of nozzles 16, a reduced number of pressure chambers 33, a reduced number of restrictors 35, and a reduced number of piezoelectric devices 44 are illustrated in FIG. 6. The operation of discharging ink drops in this head portion 29 is well known in the art, and a description thereof will be omitted.

FIG. 7A and FIG. 7B show the positional relationship of the connector 20 at the time of connection of the twistable flat cable 19 and the outline composition of the flexible printed circuit board 25 for each of a comparative example and the present embodiment. FIG. 7A shows a flexible printed circuit board 25 of the comparative example. FIG. 7B shows the flexible printed circuit board 25 of the present embodiment.

As shown in FIG. 7A and FIG. 7B, a cable-end connector 157 is attached to the end of the twistable flat cable 19, and the connector 157 and the connector 20 are mated at the time of connection of the twistable flat cable 19.

Next, a method of reducing a mechanical stress generated when connecting the twistable flat cable 19 to the connector 20 attached to the image-data control circuit board 24 will be described.

In the comparative example of FIG. 7A, a diameter of the through hole 48 formed in the image-data control circuit board 24 is almost equal to a diameter of the fixing screw 22, and the image-data control circuit board 24 is fixed directly to the side of the ink tank 27 by the fixing screw 22.

The connector 20 is attached to the image-data control circuit board 24 as described above. When the image-data control circuit board 24 is fixed to the ink tank 27, the connector 20 is slightly lifted from the ink tank 27, and a clearance 158 between the connector 20 and the ink tank 27 is presented as shown in FIG. 7A.

In the comparative example of FIG. 7A, a mechanical stress is generated when the connector 157 of the twistable flat cable 19 is connected to the connector 20 attached to the image-data control circuit board 24, and this stress is concentrated onto the fixed portion of the image-data control circuit board 24 where the fixing screw 22 is fastened. At this time, as shown in FIG. 7A, the image-data control circuit board 24 may be curved or deformed, and cracks in the soldered parts of the image-data control IC 23 may form due to deformation of the image-data control circuit board 24.

To eliminate the problem, the image-data control circuit board 24 in the present embodiment is not fixed directly to the side of the ink tank 27 by the fixing screw 22, as shown in FIG. 7B, and the diameter of the through hole 48 formed in the image-data control circuit board 24 is larger than the diameter of the fixing screw 22. Specifically, the diameter of the through hole 48 is set to a value which is larger than a sum of the diameter of the fixing screw 22 and a dimensional tolerance of the printing head main part 14 in the height direction thereof.

In the present embodiment, the diameter of the fixing screw 22 is set to 3.0 mm, and the diameter of the through hole 48 is set to 8.0 mm. Hence, the image-data control circuit board 24 is movable in a sliding direction within the head cover 21 by a distance of ±2.50 mm.

In the present embodiment, in a state before the twistable flat cable 19 (or the connector 157) is connected to the connector 20 attached to the image-data control circuit board 24, the clearance 158 between the connector 20 and the head cover 21 is initially presented as shown in FIG. 5.

However, when the connector 157 of the twistable flat cable 19 is depressed and connected to the connector 20 attached to the image-data control circuit board 24, the bottom surface of the connector 20 securely comes in contact with the top surface of the ink tank 27 as shown in FIG. 7B.

The flexible printed circuit board 25 is able to be easily bent. However, for the purpose of reducing the size of the printing head main part 14, if the flexible printed circuit board 25 is shortened to several millimeters as shown in FIG. 7A, resistance occurs at the time of bending of the shortened circuit board 25. The flexibility in such a case will be lost. Hence, the flexible printed circuit board 25 in such a case does not function to buffer the movement of the image-data control circuit board 24 in the up/down direction thereof at the time of connection of the twistable flat cable 19.

In the present embodiment, as shown in FIG. 7B, the flexible printed circuit board 25 is arranged in a bent condition between the image-data control circuit board 24 and the head board 28, such that the flexible printed circuit board 25 has a generally U-shaped cross-section as viewed in FIG. 7B and is able to expand and contract. Hence, the flexible printed circuit board 25 of the present embodiment can provide a buffer function to buffer the movement of the image-data control circuit board 24, without increasing the size of the printing head main part. For example, the image-data control circuit board 24 is moved within the head cover 21 in a range of ±2.50 mm in the up/down direction, and the flexible printed circuit board 25 of the present embodiment provides the buffer function.

Therefore, in the present embodiment, the image-data control circuit board 24 is arranged within the head cover 21 to be movable in the up/down direction and the flexible printed circuit board 25 is arranged in a bent condition such that the flexible printed circuit board 25 has a generally U-shaped cross-section and can expand and contract. The mechanical stress generated at the time of connection of the twistable flat cable 19 can be received and absorbed by the entire printing head main part 14 in which the connector 20 securely comes in contact with the ink tank 27.

Hence, without increasing the size of the printing head main part, it is possible to eliminate the problem of the curving or deformation of the image-data control circuit board 24 as shown in FIG. 7A, which may cause cracks in the soldered parts of the image-data control IC 23.

FIG. 8 is an enlarged cross-sectional view of a rigid/flexible circuit board 49.

In the present embodiment, the image-data control circuit board 24, the flexible printed circuit board 25, and the head board 28 are not arranged as separate circuit boards which are connected together by the connectors; rather, these circuit boards 24, 25 and 28 are formed into a single rigid/flexible circuit board 49 in which these circuit boards are continuously interconnected. For the sake of convenience, an enlarged cross-sectional view of the rigid/flexible circuit board 49 is shown in FIG. 8.

As shown in FIG. 8, the rigid/flexible circuit board 49 has a multi-layer structure and generally includes a power supply copper-foil layer 50, first insulating layers 51a, a second insulating layer 51b, and a first signal copper-foil layer 52a. The power supply copper-foil layer 50 is formed in the middle in a thickness direction of the rigid/flexible circuit board 49. The first insulating layers 51a are formed on the top and bottom surfaces of the power supply copper-foil layer 50 and made of, for example, a polyimide film. The first signal copper-foil layer 52a is formed on the upper first upper insulating layer 51a, and the second insulating layer 51b is formed on the first signal copper-foil layer 52a and made of, for example, a polyimide film.

Further, in the rigid/flexible circuit board 49, second signal copper-foil layers 52b are formed under the bottom surface of the first insulating layer 51a and over the top surface of the second insulating layer 51b via first adhesive layers 53a, respectively. Further, outer insulating layers 54 which are made of, for example, a polyimide film are formed over the top surface of the upper second signal copper-foil layer 52b and under the bottom surface of the lower second signal copper-foil layer 52b via second adhesive layers 53b, respectively.

The middle portion of the rigid/flexible circuit board 49, corresponding to the flexible printed circuit board 25, is thinned into a flexible printed circuit board 25a with good flexibility by removing the upper and lower first adhesive layers 53a, the upper and lower second signal copper-foil layers 52b, the upper and lower second adhesive layers 53b, and the outer insulating layers 54 by using an appropriate removing method.

The left-side portion of the rigid/flexible circuit board 49, which is contiguous to one end of the flexible printed circuit board 25a, is formed into an image-data control circuit board 24a. The right-side portion of the rigid/flexible circuit board 49, which is contiguous to the other end of the flexible printed circuit board 25a, is formed into a head board 28a.

Accordingly, the image-data control circuit board 24a and the head board 28a have the same layered structure, the top and bottom surfaces of these boards are covered by the outer insulating layers 54, and these boards are electrically insulated by the insulation material. On the other hand, the top and bottom surfaces of the flexible printed circuit board 25a are covered by the second insulating layer 51b and the first insulating layer 51a, respectively, and the flexible printed circuit board 25a is also electrically insulated by the insulation material.

Although not illustrated, the image-data control IC 23 is mounted on the image-data control circuit board 24a, and the piezoelectric device driver IC 47 is mounted on the head board 28a. The power supply copper-foil layer 50 functions to supply power to the image-data control IC 23 and the piezoelectric device driver IC 47, and the signal copper-foil layer 52 functions to transmit an image-data signal and a driving waveform signal to the image-data control IC 23 and the piezoelectric device driver IC 47.

Further, in the image-data control circuit board 24a, a conductive via plug (or via hole) 55a is formed to electrically interconnect the image-data control IC 23, the power supply copper-foil layer 50 and the signal copper-foil layer 52. In the head board 28a, a conductive via plug (or via hole) 55b is formed to electrically interconnect the piezoelectric device driver IC 47, the power supply copper-foil layer 50 and the signal copper-foil layer 52.

Use of the above-described rigid/flexible circuit board 49 makes the housing of the connectors for interconnecting the circuit boards unnecessary, and the housing space can be saved and the man-hours of the interconnections of the circuit boards can be reduced. In addition, the contact resistance by the connectors is eliminated, and the impedance control between the circuit boards can be performed to carry out the ink discharge control with good accuracy.

Figure 9:
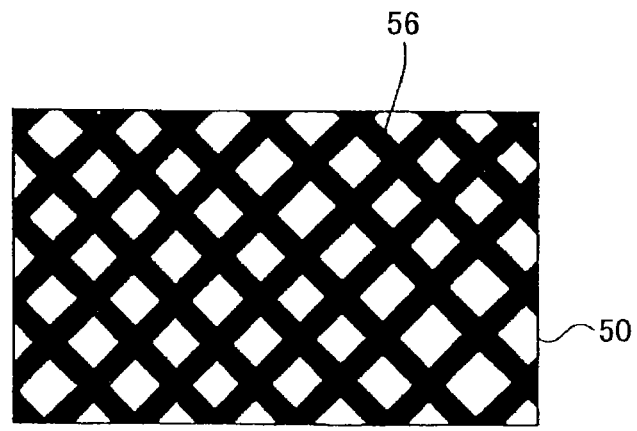
FIG. 9 is a plan view of a pattern of wiring lines of a power supply copper-foil layer in the flexible printed circuit board of the ink jet printing head.

FIG. 9 shows a pattern of wiring lines of the power supply copper-foil layer 50 in the flexible printed circuit board 25a.

The flexible printed circuit board 25a has good flexibility and can be easily bent. However, the flexibility of the flexible printed circuit board 25a falls if the amount of wiring lines of the copper-foil layer which constitutes the flexible printed circuit board 25a increases.

It is common to form the pattern of wiring lines 56 of the power supply copper-foil layer 50 into a solid wiring pattern. However, the wiring lines of the power supply copper-foil layer 50 in the flexible printed circuit board 25a of the present embodiment are formed into a mesh wiring pattern in which the wiring lines intersect each other at very small intervals as shown in FIG. 9, and the flexibility of the flexible printed circuit board 25a can be increased. The width of each of the wiring lines of the mesh wiring pattern may be determined such that the current flowing across a total of the widths of the wiring lines of the mesh wiring pattern satisfies the maximum permissible current of the power supply.

The manufacturing efficiency of the rigid/flexible circuit board 49 can be further increased by forming the power supply copper-foil layer 50 of the image-data control circuit board 24a and the head board 28a into a mesh wiring pattern which is the same as the pattern of wiring lines 56 of the flexible printed circuit board 25a.

Figure 10A:
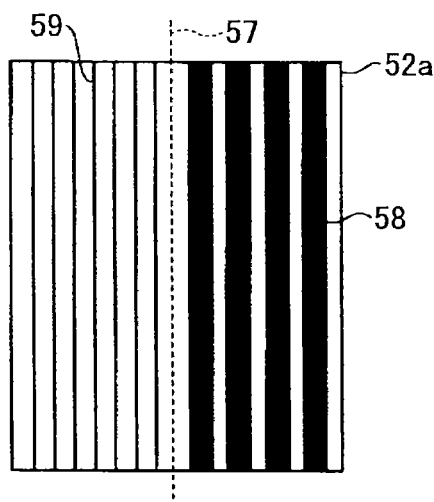
FIG. 10A and FIG. 10B are diagrams showing a pattern of wiring lines of a signal copper-foil layer in a flexible printed circuit board for each of a comparative example and the present embodiment.
Figure 10B:
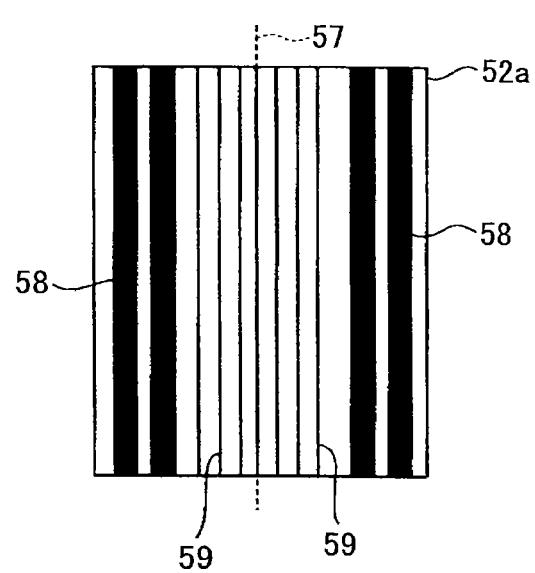

FIG. 10A and FIG. 10B show a pattern of wiring lines of the signal copper-foil layer 52a in the flexible printed circuit board 25a for each of a comparative example and the present embodiment. FIG. 10A shows the pattern of wiring lines of the comparative example. FIG. 10B shows the pattern of wiring lines of the signal copper-foil layer 52a in the flexible printed circuit board 25a of the present embodiment.

FIG. 11A and FIG. 11B are top views of printing head main parts of the comparative example and the present embodiment. FIG. 11A shows a printing head main part of the comparative example. FIG. 11B shows the printing head main part 14 of the present embodiment.

As shown in FIG. 10A and FIG. 10B, for each of the comparative example and the present embodiment, a pattern of wiring lines 59 for image-data signals (a width of each wiring line thereof is about 0.1 mm), and a pattern of wiring lines 58 for driving waveform signals (a width of each wiring line thereof is about 3 mm) are formed in the signal copper-foil layer 52a.

In the comparative example of FIG. 10A, the wiring pattern 58 for driving waveform signals is formed only on one side of the signal copper-foil layer 52a with respect to the central line 57 thereof. In a case of the comparative example, when bending the flexible printed circuit board 25 and mounting the same on the side of the ink tank 27, the side of the flexible printed circuit board 25 in which the pattern of the driving waveform signal wiring lines 58 is formed with a larger amount of copper foil becomes difficult to bend. Hence, as shown in FIG. 11A, when the flexible printed circuit board 25 is bent, deformation or curving of the board takes place. Because it is difficult to mount the flexible printed circuit board 25 in a position parallel to the side of the ink tank 27, the deformed circuit board may become an obstacle to the subsequent process of attaching the head cover 21 for covering the image-data control circuit board 24.

To eliminate the problem, in the present embodiment, as shown in FIG. 10B, the wiring pattern 58 for driving waveform signals is formed so that the amount of copper foil of the wiring lines is distributed equally on the right and left sides of the signal copper-foil layer 52a with respect to the central line 57 thereof. In a case of the present embodiment, when bending the flexible printed circuit board 25 and mounting the same on the side of the ink tank 27, the flexible printed circuit board 25 can be placed parallel to the side of the ink tank 27. Subsequently, the head cover 21 for covering the image-data control circuit board 24 can easily be attached.

Moreover, in the embodiment of FIG. 10B, in order to prevent the cracks in the flexible printed circuit board 25, the wiring pattern 58 for driving waveform signals is formed so that the wiring lines are arranged at the outer portions of the right and left sides of the signal copper-foil layer 52a with respect to the central line 57. This is because the wiring pattern 58 is comparatively resistant to cracking.

Figure 12:
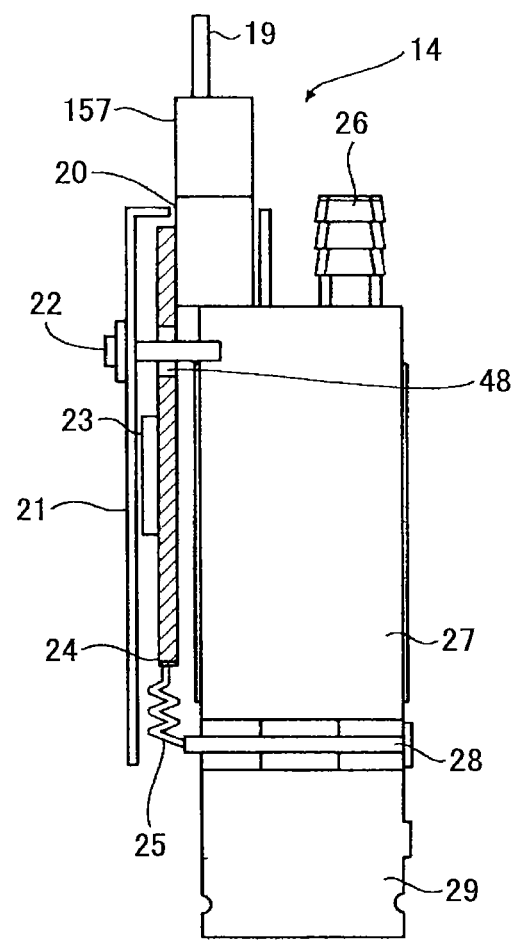
FIG. 12 is a diagram showing the positional relationship of a connector at a time of connection of a twistable flat cable and the outline composition of a flexible printed circuit board according to a second embodiment of the present disclosure.

Next, FIG. 12 shows the positional relationship of a connector at a time of connection of a twistable flat cable and the outline composition of a flexible printed circuit board according to a second embodiment of the present disclosure.

The flexible printed circuit board 25 of the second embodiment shown in FIG. 12 differs from the flexible printed circuit board 25 of the first embodiment shown in FIG. 7B in that the flexible printed circuit board 25 of the second embodiment has a bellows configuration.

In the second embodiment, the flexible printed circuit board 25 has a bellows configuration and the image-data control circuit board 24 is movable within the head cover 21 in the up/down direction. Hence, it is possible to improve the function of the flexible printed circuit board 25 to buffer the movement of the image-data control circuit board 24 without increasing the size of the printing head main part.

Figure 13:
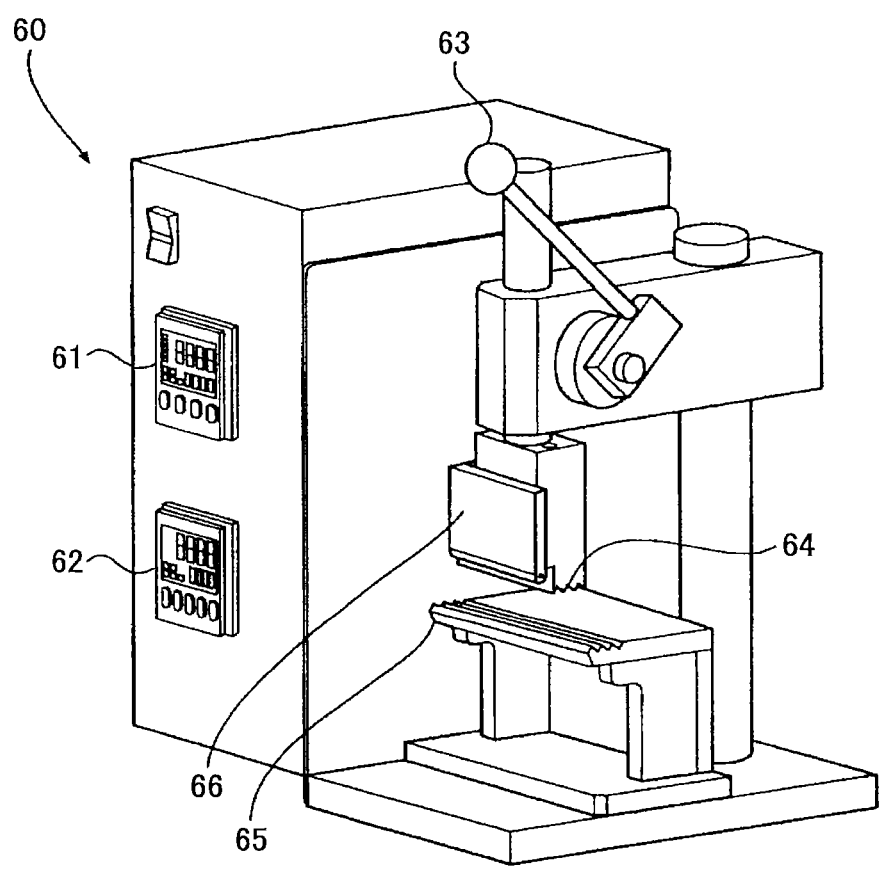
FIG. 13 is a perspective view of a bending machine which deforms the flexible printed circuit board of the second embodiment to have a bellows configuration.
Figure 14:
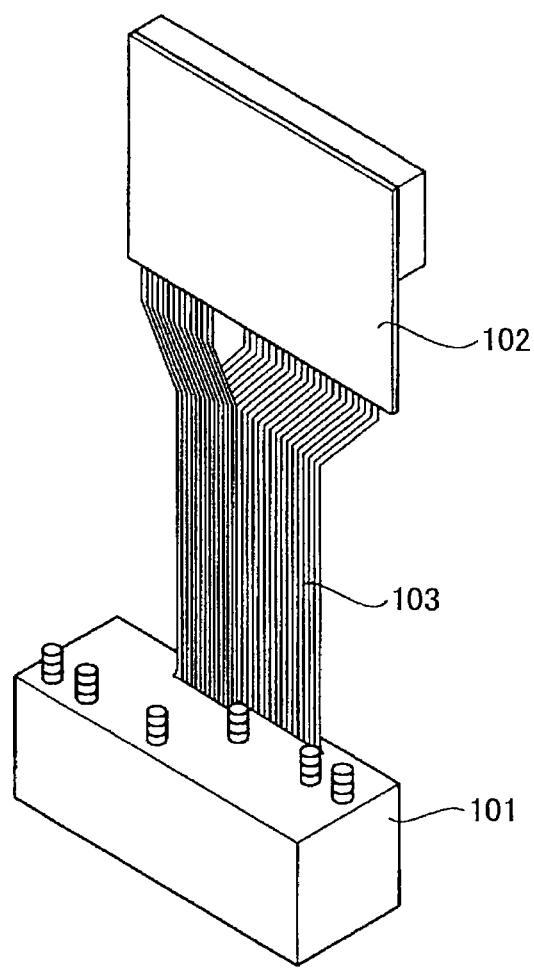
FIG. 14 is a perspective view of an ink jet printing head according to the related art.

FIG. 13 is a perspective view of a flexible-printed-circuit-board bending machine 60 which deforms the flexible printed circuit board 25 to have a bellows configuration. As shown in FIG. 13, the bending machine 60 generally includes a thermo-regulator 61, a digital timer 62, a hand press 63, an upper-face pressing plate 64, a lower-face pressuring plate 65, and a cartridge heater 66. The bending machine 60 is arranged to supply heat and pressure to the flexible printed circuit board 25 and deform the flexible printed circuit board 25 to have a bellows configuration.

As shown in FIG. 13, each of the upper-face pressing plate 64 and the lower-face pressing plate 65 is formed with plural projections each having a triangular cross-section, and the plural projections of the pressing plates extend in parallel.

The flexible printed circuit board 25 is mounted on the lower-face pressing plate 65, and the hand press 62 is depressed to a lower limit position thereof. The flexible printed circuit board 25 is inserted between the upper-face pressing plate 64 and the lower-face pressing plate 65 and a predetermined pressure is exerted thereon, so that the flexible printed circuit board 25 is deformed to have a bellows configuration through the engagement between the projections of the upper-face pressing plate 64 and the projections of the lower-face pressing plate 65.

Because the flexible printed circuit board 25 is not sufficiently deformed only by applying the predetermined pressure, the cartridge heater 66 which is heated to a predetermined temperature by using the thermo-regulator 61 is mounted on the side face of the upper-face pressing plate 64, so that the flexible printed circuit board 25 is heated concurrently with the pressurization. The heating and pressurization conditions at this time may be set not to affect the flexible printed circuit board 25.

After a time count from the digital timer 62 has reached a fixed time count, the cartridge heater 66 is turned off and the hand press 62 is released and moved up to an upper limit position thereof. A cooling fan (not illustrated) may be used to rapidly cool the flexible printed circuit board 25 in order to hold the configuration of the flexible printed circuit board 25 immediately after an end of the heating and pressurization.

According to the embodiments of the present disclosure described above, the following advantageous features can be offered.

(1) The rigid/flexible circuit board is housed in the ink jet printing head in a state in which the portion of the rigid/flexible circuit board corresponding to the flexible circuit board is bent, so that the size of the housing of the ink jet printing head can be reduced and the workability of assembling the ink jet printing head can be improved.

(2) The flexibility of the flexible printed circuit board is maintained by housing the flexible printed circuit board in a bent condition, or arranging the flexible printed circuit board to have a bellows configuration, and it is possible to provide a buffer function of the flexible printed circuit board to buffer the movement of the second rigid circuit board.

(3) The wiring pattern in the copper-foil layer of the flexible circuit board is formed so that the amount of copper foil of the wiring lines of the wiring pattern is distributed equally to the right and left sides of the copper-foil layer with respect to the central line thereof, and the flexible circuit board can easily be bent and housed in the ink-jet printing head.

As described in the foregoing, according to the present disclosure, it is possible to provide an ink jet printing head with good quality which does not cause deformation or curving of the first rigid circuit board due to the stress generated at the time of connection of the twistable flat cable and concentrated on the fixed portion of the first rigid circuit board and does not cause occurrence of cracks or the like in the connected portions of the first rigid circuit board, such as the soldered portions.

The present disclosure is not limited to the specifically disclosed embodiments, and variations and modifications may be made without departing from the scope of the present disclosure. For example, in the foregoing embodiments, the ink jet printing head which uses the piezoelectric devices as the driving elements for discharging ink drops has been described. The present disclosure is not limited to the foregoing embodiments and may be also applied to ink jet printing heads which use driving elements of other types, including a thermal-type ink jet printing head which uses thermoelectric conversion elements as the driving elements for discharging ink drops, an electrostatic-type ink jet printing head which uses electrostatic conversion elements as the driving elements for discharging ink drops, etc.

The present application is based upon and claims the benefit of priority of Japanese Patent Application No. 2011-150276, filed on Jul. 6, 2011, and Japanese Patent Application No. 2012-029458, filed on Feb. 14, 2012, the contents of which are incorporated herein by reference in their entirety.

What is claimed is:
1. An ink jet printing head, comprising:
a head portion including nozzles, pressure chambers which store ink and communicate with the nozzles, and driving elements which pressurize the ink in the pressure chambers to discharge ink drops from the nozzles;
an ink tank disposed over the head portion to accommodate ink which is supplied to the pressure chambers of the head portion;
a first rigid circuit board including an image-data control unit to output an image-data signal;
a second rigid circuit board including a driving element driver unit to output a driving waveform signal to the driving elements of the head portion in accordance with the image-data signal output from the first rigid circuit board;

a flexible printed circuit board arranged to electrically interconnect the first rigid circuit board and the second rigid circuit board; and a connector attached to an end portion of the first rigid circuit board opposite to the flexible printed circuit board and connected to the image-data control unit so that the image-data control unit is connectable to a host board through the connector, wherein the connector is disposed on a top surface of the ink tank, the first rigid circuit board is disposed on a side of the ink tank, the second rigid circuit board is disposed between the ink tank and the head portion, and the flexible printed circuit board is disposed in a bent condition between the first rigid circuit board and the second rigid circuit board.

2. The ink jet printing head according to claim 1, wherein a head cover is arranged outside the first rigid circuit board and fixed to the ink tank by a fixing screw which penetrates the first rigid circuit board, and the first rigid circuit board is formed with a through hole having a diameter larger than a diameter of the fixing screw, so that the first rigid circuit board when the head cover is fixed to the ink tank by the fixing screw is movable within the head cover in an up/down direction.

3. The ink jet printing head according to claim 1, wherein the first rigid circuit board, the flexible printed circuit board, and the second rigid circuit board are formed into a rigid/flexible circuit board in which the first rigid circuit board, the flexible printed circuit board, and the second rigid circuit board are continuously interconnected, and the flexible printed circuit board is formed to have a bellows configuration.

4. The ink jet printing head according to claim 3, wherein a power supply metal foil layer to supply power and a signal metal foil layer to transmit signals are formed via an insulating layer in a layered structure and extend from the first rigid circuit board to the second rigid circuit board through the flexible printed circuit board, wherein the image-data control unit is mounted on the first rigid circuit board and a first via plug is formed in the first rigid circuit board to electrically interconnect the power supply metal foil layer, the signal metal foil layer and the image-data control unit; and wherein the driving element driver unit is mounted on the second rigid circuit board, and a second via plug is formed in the second rigid circuit board to electrically interconnect the power supply metal foil layer, the signal metal foil layer and the driving element driver unit.

5. The ink jet printing head according to claim 3, wherein the flexible printed circuit board is thinned to have a thickness smaller than a thickness of each of the first rigid circuit board and the second rigid circuit board, and an insulating layer is formed on both top and bottom surfaces of each of the first rigid circuit board, the flexible printed circuit board and the second rigid circuit board.

6. The ink jet printing head according to claim 3, wherein at least wiring lines of the power supply metal foil layer in the flexible printed circuit board are formed into a mesh wiring pattern in which the wiring lines intersect each other at small intervals.

7. The ink jet printing head according to claim 6, wherein wiring lines of the power supply metal foil layer in each of the first rigid circuit board and the second rigid circuit board are formed into a mesh wiring pattern which is the same as the mesh wiring pattern in the flexible printed circuit board.

8. The ink jet printing head according to claim 4, wherein wiring lines of the signal metal foil layer in the flexible printed circuit board are equally distributed on right and left sides of the signal metal foil layer with respect to a central line of the flexible printed circuit board.

9. An ink jet printing device comprising:

the ink jet printing head according to claim 1; and a recording-sheet transporting device that transports a recording sheet to the ink jet printing head.

* * * * *